United States Patent
Koiwa et al.

(10) Patent No.: US 11,522,206 B2
(45) Date of Patent: Dec. 6, 2022

(54) METHOD OF STOPPING OPERATION OF FUEL CELL SYSTEM

(71) Applicant: HONDA MOTOR CO., LTD., Tokyo (JP)

(72) Inventors: Nobuki Koiwa, Wako (JP); Shinya Watanabe, Wako (JP); Yuji Matsumoto, Wako (JP); Kazuhide Inoue, Wako (JP)

(73) Assignee: Honda Motor Co., Ltd., Tokyo (JP)

(*) Notice: Subject to any disclaimer, the term of this patent is extended or adjusted under 35 U.S.C. 154(b) by 99 days.

(21) Appl. No.: 17/205,447

(22) Filed: Mar. 18, 2021

(65) Prior Publication Data

US 2021/0296667 A1 Sep. 23, 2021

(30) Foreign Application Priority Data

Mar. 19, 2020 (JP) .............................. JP2020-048614

(51) Int. Cl.
| | | |
|---|---|---|
| *H01M 8/04537* | (2016.01) | |
| *H01M 8/04223* | (2016.01) | |
| *G01R 31/389* | (2019.01) | |
| *G01R 27/02* | (2006.01) | |

(52) U.S. Cl.
CPC ........ *H01M 8/04649* (2013.01); *G01R 27/02* (2013.01); *G01R 31/389* (2019.01); *H01M 8/04223* (2013.01)

(58) Field of Classification Search
CPC . G01R 27/02; G01R 31/389; H01M 2250/20; H01M 8/04223; H01M 8/04228; H01M 8/04303; H01M 8/04649; H01M 8/04768; H01M 8/04952; Y02E 60/50; Y02T 90/40
See application file for complete search history.

(56) References Cited

U.S. PATENT DOCUMENTS

| | | | |
|---|---|---|---|
| 2006/0073367 A1 | 4/2006 | Kanno et al. | |
| 2008/0166609 A1* | 7/2008 | Kitamura | ............ H01M 8/0485 429/492 |

FOREIGN PATENT DOCUMENTS

JP 2004-311277 A 11/2004

* cited by examiner

*Primary Examiner* — Victoria H Lynch
(74) *Attorney, Agent, or Firm* — Carrier Blackman & Associates, P.C.; Joseph P. Carrier; Fulchand P. Shende

(57) ABSTRACT

A fuel cell system includes a fuel cell stack of a plurality of power generation cells and an impedance measuring device for measuring the impedance in the fuel cell stack. When stopping the operation of the fuel cell system, a method for stopping the operation of the fuel cell system operates the plurality of power generation cells to generate electric power, until the impedance value becomes equal to or greater than an objective impedance value. After the impedance value has become equal to or greater than the objective impedance value, the operation stopping method still continues the power generation of the multiple power generation cells for a given period of time.

6 Claims, 5 Drawing Sheets

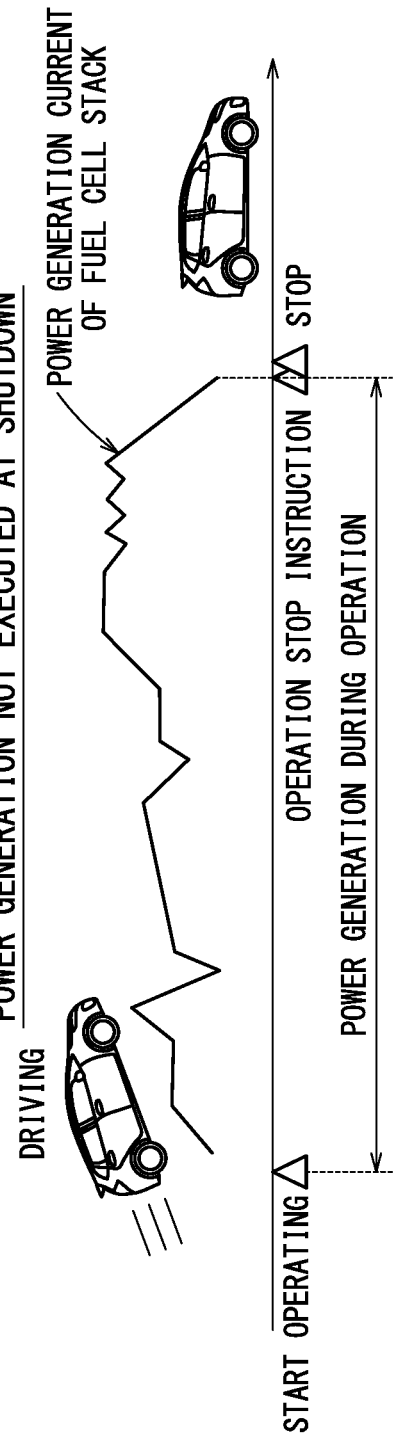
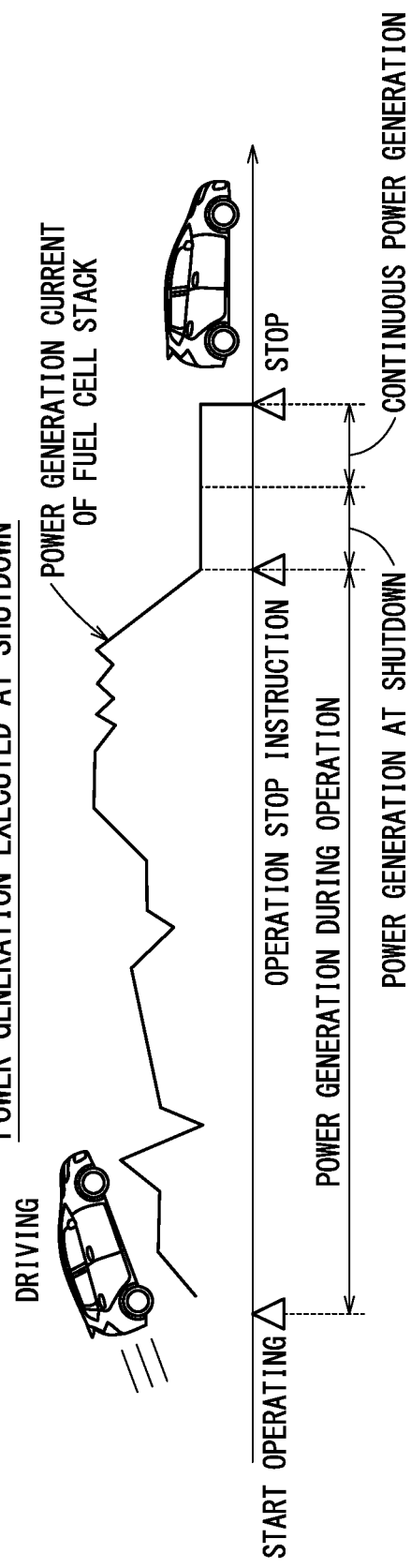

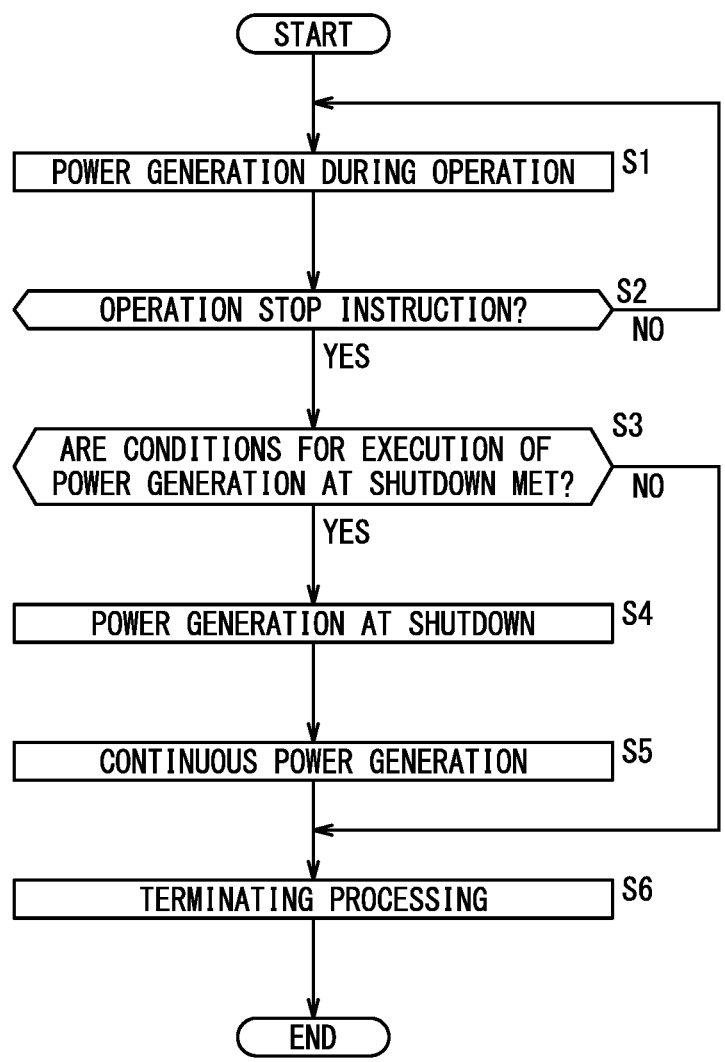

METHOD OF STOPPING OPERATION OF FUEL CELL SYSTEM

CROSS-REFERENCE TO RELATED APPLICATION

This application is based upon and claims the benefit of priority from Japanese Patent Application No. 2020-048614 filed on Mar. 19, 2020, the contents of which are incorporated herein by reference.

BACKGROUND OF THE INVENTION

Field of the Invention

The present invention relates to a method of stopping the operation of a fuel cell system.

Description of the Related Art

A fuel cell system includes a fuel cell stack that generates electric power through reactions between anode gas (a fuel gas such as hydrogen etc.) and cathode gas (an oxidizing gas such as oxygen etc.). In fuel cell systems of this type, the internal power generation cells will freeze due to the water remaining in the fuel cell stack, if the temperature in the surrounding environment decreases low (e.g. below the freezing point) after its operation was stopped (after its power generation was stopped). This leads to the inconveniences of the fuel cell systems that the next starting takes time, power generation efficiency lowers, etc.

To solve this problem, Japanese Laid-Open Patent Publication No. 2004-311277 discloses a fuel cell system in which, when stopping, the power generating operation is stopped after performing a power generating process to bring the temperature of the fuel cells above a given value, so as to dry the inside of the fuel cell stack.

SUMMARY OF THE INVENTION

By the way, in a fuel cell stack including a plurality of power generation cells, the temperature of the power generation cells disposed at both ends of the stacking direction tends to decrease lower compared to the temperature of power generation cells disposed in the center area in the stacking direction. Accordingly, even if the power generating process is performed when stopping as disclosed in Japanese Laid-Open Patent Publication No. 2004-311277 that the cells disposed at the ends may still contain water without being dried sufficiently. Then, even if the power generating process is performed when stopping, the water in the power generation cells (especially, cells disposed at the ends) in the fuel cell stack will freeze if the temperature in the surrounding environment falls low.

The present invention is related to the technique regarding fuel cell systems, and an object of the invention is to provide a method for stopping the operation of a fuel cell system that can more uniformly dry a plurality of power generation cells in the fuel cell stack when stopping its operation.

In order to achieve the object above, an aspect of the present invention is directed to a method of stopping operation of a fuel cell system including a fuel cell stack having a stack of a plurality of power generation cells that generate electric power through a reaction between an anode gas and a cathode gas, and an impedance measuring unit for measuring an impedance of the fuel cell stack. The method includes: a power generation at shutdown step of, when stopping the operation, causing the plurality of power generation cells to generate electric power, until the impedance value measured by the impedance measuring unit becomes equal to or greater than an objective impedance value; and a continuous power generation step of, after the impedance value has become equal to or greater than the objective impedance value, further continuing the power generation of the plurality of power generation cells for a given period of time.

The above-described method of stopping the operation of a fuel cell system can more uniformly dry a plurality of power generation cells in a fuel cell stack when stopping its operation.

The above and other objects, features, and advantages of the present invention will become more apparent from the following description when taken in conjunction with the accompanying drawings, in which a preferred embodiment of the present invention is shown by way of illustrative example.

BRIEF DESCRIPTION OF THE DRAWINGS

FIG. 2A is an explanatory diagram schematically illustrating a variation in power generation current of a fuel cell stack in a case where a power generation process is not performed at shutdown; FIG. 2B is an explanatory diagram schematically illustrating a variation in power generation current of the fuel cell stack in a case where the power generation process is performed at shutdown;

FIG. 3 is a flowchart showing an example process of the method for stopping the operation of the fuel cell system;

DESCRIPTION OF THE PREFERRED EMBODIMENTS

The present invention will be described in detail in connection with preferred embodiments while referring to the accompanying drawings.

Figure 1:
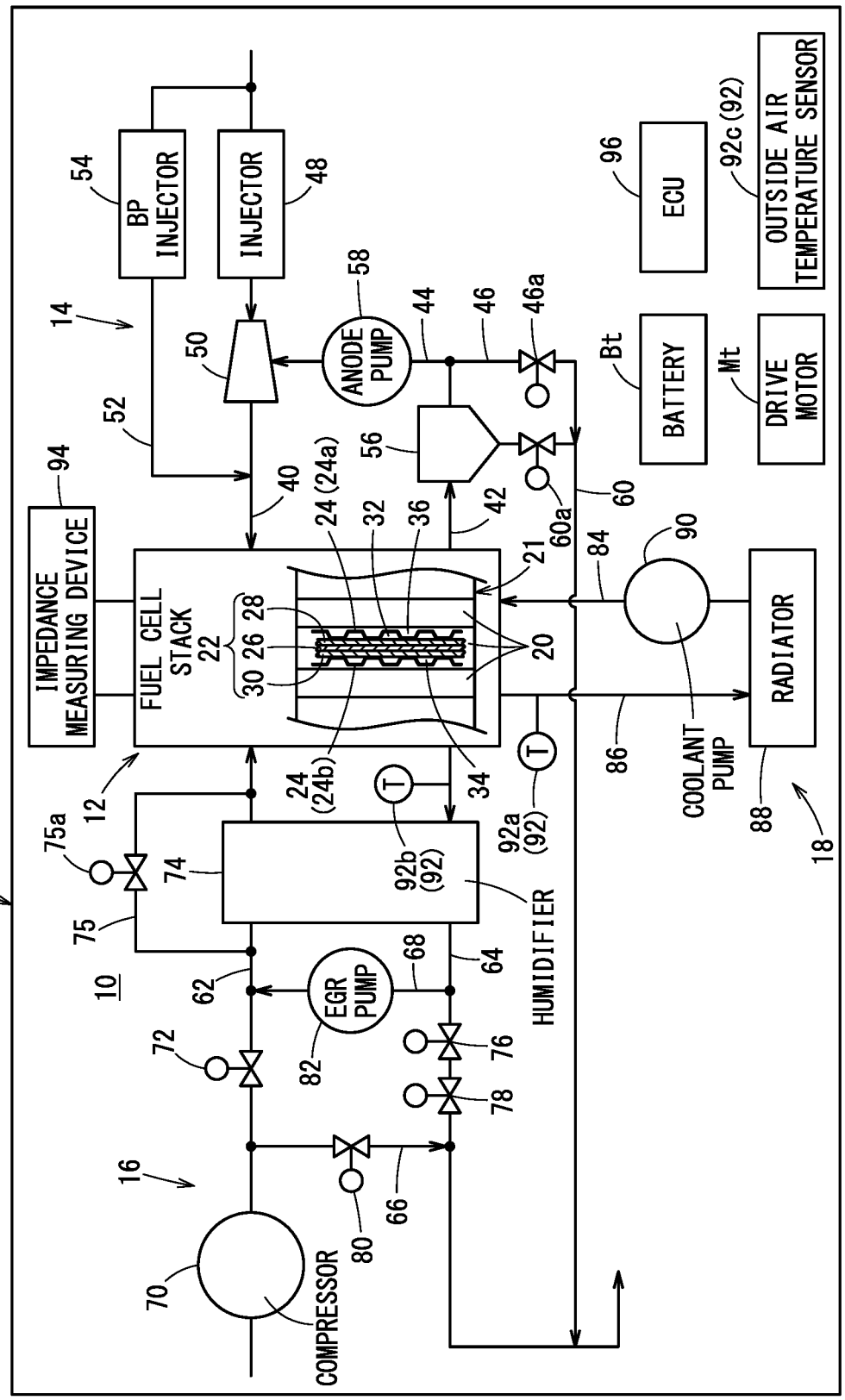
FIG. 1 is an explanatory diagram used to explain an overall configuration of a fuel cell system according to an embodiment of the invention.

As shown in FIG. 1, a fuel cell system 10 according to an embodiment of the present invention includes a fuel cell stack 12, anode-related devices 14, cathode-related devices 16, and cooling devices 18. The fuel cell system 10 is installed in, for example, a motor room of a fuel cell vehicle 11 (fuel cell automobile, which will hereinafter be simply referred to as vehicle 11). The electric power generated by the fuel cell stack 12 is supplied to a battery Bt, drive motor Mt, and so on, in order to drive the vehicle 11.

The fuel cell stack 12 includes a plurality of power generation cells 20 that generate electricity through electrochemical reactions between anode gas (a fuel gas such as hydrogen) and cathode gas (an oxygen-containing gas such as air). The plurality of power generation cells 20 are assembled to form a stack 21 in such a manner that, when the fuel cell stack 12 is mounted in the vehicle 11, the power generation cells 20 are stacked along the vehicle's width direction, with their respective electrode planes arranged in a standing position. The plurality of power generation cells 20 may be stacked along the length direction of the vehicle 11 (front-rear direction) or the gravity direction.

Each power generation cell 20 includes a membrane electrode assembly 22 (hereinafter referred to as "MEA 22") and a pair of separators 24 (separator 24a and separator 24b) that sandwich the MEA 22 therebetween. The MEA 22 includes an electrolyte membrane 26 (e.g. solid polymer electrolyte membrane (cation exchange membrane)), an anode 28 provided at one surface of the electrolyte membrane 26, and a cathode 30 provided at the other surface of the electrolyte membrane 26. The separator 24a forms an anode gas flow field 32 at one surface of the MEA 22 through which the anode gas flows. The separator 24b forms a cathode gas flow field 34 at the other surface of the MEA 22 through which the cathode gas flows. Further, as the plurality of power generation cells 20 are stacked, the opposing surfaces of separators 24a and 24b form a coolant flow field 36 through which a coolant flows.

The fuel cell stack 12 further includes a plurality of passages (anode gas passages, cathode gas passages, and coolant passages, which are not shown) for respectively conveying the anode gas, the cathode gas, and the coolant along the stacking direction of the stack 21. The anode gas passages communicate with the anode gas flow field 32, the cathode gas passages communicate with the cathode gas flow field 34, and the coolant passages communicate with the coolant flow field 36.

The fuel cell stack 12 is supplied with the anode gas through the anode-related devices 14. In the fuel cell stack 12, the anode gas flows through the anode gas passage (anode gas inlet passage) into the anode gas flow field 32 and is used to generate power at the anode 28. The anode off-gas that has been used in the power generation (which contains unreacted hydrogen) flows out of the anode gas flow field 32 into the anode gas passage (anode gas outlet passage) and is discharged out of the fuel cell stack 12 into the anode-related devices 14.

The fuel cell stack 12 is further supplied with the cathode gas through the cathode-related devices 16. In the fuel cell stack 12, the cathode gas flows through the cathode gas passage (cathode gas inlet passage) into the cathode gas flow field 34, and is used to generate power at the cathode 30. The cathode off-gas, having been used in the power generation, flows out of the cathode gas flow field 34 into the cathode gas passage (cathode outlet passage) and is discharged out of the fuel cell stack 12 into the cathode-related devices 16.

The fuel cell stack 12 is further supplied with the coolant through the cooling devices 18. In the fuel cell stack 12, the coolant flows through the coolant passage (coolant inlet passage) into the coolant flow field 36 to cool the power generation cell 20. Having cooled the power generation cell 20, the coolant flows out of the coolant flow field 36 into the coolant passage (coolant outlet passage) and is discharged out of the fuel cell stack 12 into the cooling devices 18.

In the fuel cell stack 12 of the embodiment, the stack 21 is accommodated in a stack case (not shown). A terminal plate, insulation plate, and end plate (not shown) are provided in order in the outward direction at either end of the stacking direction of the stack 21. The end plates apply a fastening load along the stacking direction of the power generation cells 20.

The anode-related devices 14 of the fuel cell system 10 include an anode supply channel 40 for supplying the anode gas into the fuel cell stack 12, and an anode discharge channel 42 for discharging the anode off-gas from the fuel cell stack 12. Further, an anode circulation channel 44 is connected between the anode supply channel 40 and the anode discharge channel 42, so as to return the unreacted hydrogen contained in the anode off-gas in the anode-discharge channel 42 back into the anode supply channel 40. Further, a purge channel 46 is connected to the anode circulation channel 44 so as to discharge the anode off-gas from the circulation circuit of the anode-related devices 14.

An injector 48 and an ejector 50 are connected in series on the anode supply channel 40, and a supply-side bypass channel 52 is also connected to the anode supply channel 40 to bypass the injector 48 and the ejector 50. A BP (bypass) injector 54 is provided on the supply-side bypass channel 52. The injector 48 is the main injector that is used chiefly during power generation operation, and the BP injector 54 is a sub injector that is used to supply high-concentration hydrogen when, for example, the fuel cell stack 12 is started or when heavy-load power generation is required.

The ejector 50 supplies the anode gas into the fuel cell stack 12 disposed downstream, while drawing the anode off-gas from the anode circulation channel 44 by utilizing the negative pressure produced by the movement of the anode gas injected from the injector 48.

A gas-liquid separator 56 is provided on the anode discharge channel 42 so as to separate water contained in the anode off-gas (water produced during power generation) from the anode off-gas. The anode circulation channel 44 is connected to an upper part of the gas-liquid separator 56 and thus the anode off-gas (gas) flows into the anode circulation channel 44.

An anode pump 58 is provided on the anode circulation channel 44 so as to circulate the anode off-gas into the anode supply channel 40. Connected to the bottom of the gas-liquid separator 56 is one end of a drain channel 60 for discharging the separated water. The drain channel 60 has a drain valve 60a for opening and closing the channel. The purge channel 46 is connected to the drain channel 60 and has a purge valve 46a provided thereon for opening and closing the channel.

The cathode-related devices 16 of the fuel cell system 10 include a cathode supply channel 62 for supplying the cathode gas into the fuel cell stack 12, and a cathode discharge channel 64 for discharging the cathode off-gas from the fuel cell stack 12. A cathode bypass channel 66 and a cathode circulation channel 68 are connected between the cathode supply channel 62 and the cathode discharge channel 64, where the cathode bypass channel 66 directly sends the cathode gas in the cathode supply channel 62 into the cathode discharge channel 64, and the cathode circulation channel 68 circulates the cathode off-gas in the cathode discharge channel 64 into the cathode supply channel 62.

A compressor 70 is provided on the cathode supply channel 62 to compress and supply air from the atmosphere. The cathode supply channel 62 has a supply-side opening/closing valve 72 provided downstream of the compressor 70 and downstream of the cathode bypass channel 66, and it also has a humidifier 74 provided between the compressor 70 (or the downstream side of the supply-side opening/closing valve 72, more specifically) and the fuel cell stack 12. Though not shown graphically, auxiliary devices, such as an intercooler for cooling the cathode gas, and so on, are provided on the cathode supply channel 62. Further, a humidifier bypass channel 75 that bypasses the humidifier 74 is provided on the cathode supply channel 62 in the vicinity of the humidifier 74, and a humidifier bypass valve 75a is provided for opening and closing the humidifier bypass channel 75. Preferably, the humidifier bypass valve 75a is opened when a power generation process at shutdown, which will be described later, is performed, so as to reduce the amount of humidification of the air (cathode gas) being supplied.

The humidifier 74 is also located on the cathode discharge channel 64. The humidifier 74 humidifies the cathode gas in the cathode supply channel 62 with the water contained in the cathode off-gas in the cathode discharge channel 64. The cathode discharge channel 64 further has a discharge-side opening/closing valve 76 and a back pressure valve 78 provided downstream of the humidifier 74 and the cathode circulation channel 68. The drain channel 60 among the anode-related devices 14 is connected to the cathode discharge channel 64.

A flow control valve 80 is provided on the cathode bypass channel 66 so as to control the flow rate of the cathode gas bypassing the fuel cell stack 12. An EGR pump 82 is provided on the cathode circulation channel 68 so as to circulate the cathode off-gas in the cathode discharge channel 64 into the cathode supply channel 62.

The cooling devices 18 of the fuel cell system 10 include a coolant supply channel 84 for supplying the coolant into the fuel cell stack 12, and a coolant discharge channel 86 for discharging the coolant from the fuel cell stack 12. The coolant supply channel 84 and the coolant discharge channel 86 are connected to a radiator 88 for cooling the coolant. A coolant pump 90 is provided on the coolant supply channel 84 so as to circulate the coolant within a coolant circulation circuit (through the fuel cell stack 12, coolant supply channel 84, coolant discharge channel 86, and radiator 88).

The fuel cell system 10 further includes a plurality of temperature sensors 92 for detecting temperatures of the fuel cell stack 12. The temperature sensors 92 include a coolant outlet temperature sensor 92a provided at an upstream portion of the coolant discharge channel 86 (on the side to the fuel cell stack 12), and a cathode outlet temperature sensor 92b provided at an upstream portion of the cathode discharge channel 64 (on the side to the fuel cell stack 12). The vehicle 11 further includes an outside air temperature sensor 92c for detecting the temperature in the surrounding environment around the vehicle 11.

The fuel cell system 10 further includes an impedance measuring device 94 for measuring an impedance of the fuel cell stack 12 (multiple power generation cells 20). The impedance value measured by the impedance measuring device 94 is linked to (correlates with) the water content in the fuel cell stack 12. The fuel cell system 10 can thus monitor the water content in the fuel cell stack 12 based on the impedance value. For example, the impedance measuring device 94 may be configured to measure the impedance by superposing alternating current on an output of the plurality of power generation cells 20 (for example, the output between the pair of terminal plates provided at both ends of the stacking direction of the fuel cell stack 12).

The fuel cell system 10 described above includes an ECU 96 (Electronic Control Unit: control unit) configured to control operations of the components of the fuel cell system 10 to operate the fuel cell stack 12 to generate electric power. The ECU 96 is composed of a computer (including microcontroller) having one or more processors, memory, and input/output interface.

As shown in FIGS. 2A and 2B, the ECU 96 of the fuel cell system 10 of the embodiment is configured to perform a power generation process at shutdown as necessary, when the driving operation is stopped (when the vehicle 11 is stopped). The power generation at shutdown is performed in order to dry the inside of the fuel cell stack 12 to prevent the freezing of the water contained in the power generation cells 20, when the temperature in the surrounding environment is estimated to become low (e.g. below the freezing point).

That is, as shown in FIG. 2A, when there is no possibility that the power generation cells 20 will freeze, then the ECU 96 immediately stops the operation (driving) of the fuel cell system 10 based on a driving stop instruction. On the other hand, as shown in FIG. 2B, when there is a possibility that the power generation cells 20 may freeze, then the vehicle 11 performs the power generation of the fuel cell system 10 at shutdown based on the driving stop instruction. The fuel cell system 10 of the embodiment is further configured to perform a continuous power generation process to continue the power generation for a given time period after the execution of the power generation at shutdown. Now, the method for stopping the operation of the fuel cell system 10 will be described in detail referring to FIG. 3.

The ECU 96 performs power generation during operation in which, while the vehicle 11 is being driven (while the vehicle 11 is operating based on turning-on of the ignition or starter switch), the anode gas and cathode gas are supplied into the fuel cell stack 12 to generate electric power (power generation during operation step: step S1). Then, the current generated by the fuel cell stack 12 is supplied to the drive motor Mt and other components to cause the vehicle 11 to travel (refer also to FIGS. 2A and 2B). In the power generation during operation, the ECU 96 appropriately controls the conditions of power generation of the fuel cell stack 12 based on power generation requirement commands from a motor ECU not shown, the conditions of running of the vehicle 11, the State Of Charge (SOC) of the battery Bt, and so on.

For example, in addition to normal power generation, the ECU 96 performs heavy-load power generation in which the amounts of supply of the anode gas and cathode gas into the fuel cell stack 12 are increased to increase the amount of power generation, low-load power generation in which the amounts of supply of the anode gas and cathode gas are reduced to reduce the amount of power generation, etc.

Furthermore, in the power generation during operation, the ECU 96 continuously monitors the water content in the fuel cell stack 12 based on the impedance value measured by the impedance measuring device 94. For example, the ECU 96 sets an objective impedance range (upper limit, lower limit) according to the state of power generation (normal power generation, heavy-load power generation, low-load power generation, etc.), and controls the amounts of supply of the reactant gases (anode gas, cathode gas) so that the impedance value falls within the objective impedance range. During the normal power generation and low-load power generation, in order to improve the durability of the fuel cell stack 12, the ECU 96 of the embodiment sets an objective impedance value Oi1 (the upper limit value of the objective impedance range, which is indicated in Ω: ohms, also in the description below) that is lower than a shutdown impedance threshold Ti which will be described later (see FIG. 4). That is, the objective impedance value Oi1 in the power generation during operation is set so that the inside of the fuel cell stack 12 is moist basically.

Further, in the execution of the power generation during operation, the ECU 96 continuously monitors whether there is an operation stop instruction from the vehicle 11 (step S2). The operation stop instruction can be an off signal of the ignition or starter switch, a driving stop signal of the motor ECU, etc., for example. When receiving no operation stop instruction (step S2: NO), the ECU 96 returns to step S1 to continue the power generation during operation, while it moves to step S3 when it receives an operation stop instruction (step S2: YES).

In step S3 after the reception of the operation stop instruction, the ECU 96 determines whether conditions for performing the power generation at shutdown are met (execution condition judging step). The conditions for performing the power generation at shutdown can include the conditions (a) to (d) below.

(a) Winter season.

(b) It is predicted that the temperature in the surrounding environment around the fuel cell system 10 will be low (the next starting will be done at low temperature).

(c) The inside of the fuel cell stack 12 contains water (undried).

(d) The impedance measuring device 94 has no problem.

The condition (a) is used as a condition for the execution of the power generation at shutdown because, in the first place, the power generation cells 20 do not freeze if it is not winter. The judgement as to whether it is winter or not can be made, for example, by providing the ECU 96 with a calendar function and determining whether it is in a predetermined winter period. Alternatively, the ECU 96 may be configured to judge whether it is winter by acquiring the current position obtained by a positioning system (not shown) of the vehicle 11 and temperature information corresponding to the current position. The condition (a) may be omitted when the condition (b) is judged.

The condition (b) is used as a condition for the execution of the power generation at shutdown because the power generation cells 20 will freeze when the temperature in the surrounding environment around the fuel cell system 10 is low. For example, as shown in FIG. 1, the ECU 96 may be configured to acquire the information detected by the outside air temperature sensor 92c (temperature sensor 92) that detects the air temperature outside the vehicle 11, and predict that the temperature will become low if the detected information is lower than a given outside air temperature value. Alternatively, the ECU 96 may be configured to predict that the temperature will become low based on the rate of temperature decrease in the surrounding environment. Alternatively, based on a fact that a low-temperature starting was done when the vehicle 11 was started in the past, it may determine that the temperature in the surrounding environment will be low by estimating that the next starting will also be done at low temperature.

The condition (c) is used as a condition for the execution of the power generation at shutdown because the power generation cells 20 are less likely to freeze if the inside of the fuel cell stack 12 is dry. The ECU 96 judges the water content in the fuel cell stack 12 by comparing the impedance value received from the impedance measuring device 94 with a previously stored shutdown impedance threshold Ti (see FIG. 4).

Figure 4:
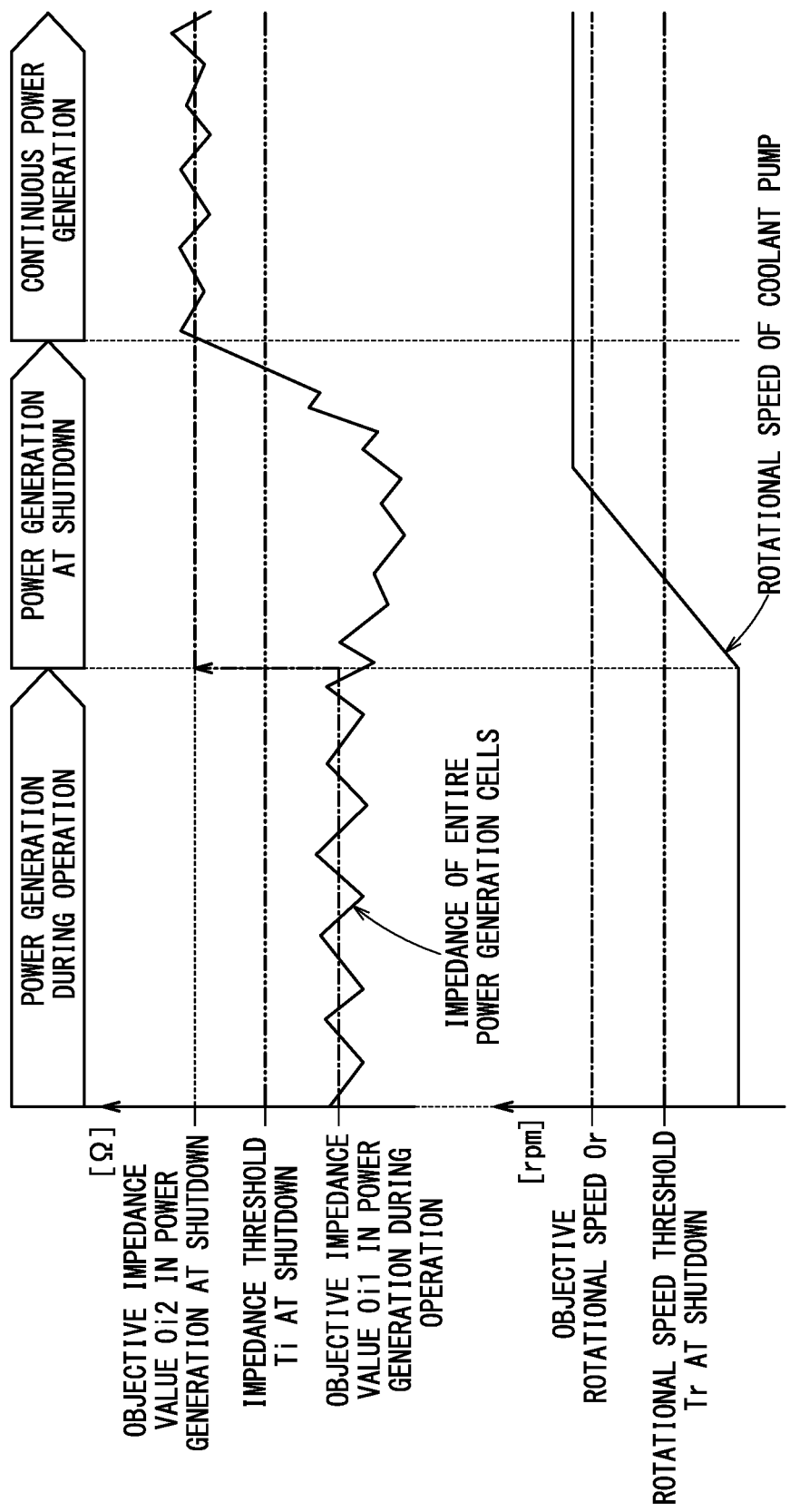
FIG. 4 is a graph schematically showing a variation in impedance and a time variation in the rotational speed of a coolant pump during power generation at shutdown and continuous power generation.

As shown in FIG. 4, the shutdown impedance threshold Ti is set to be higher (to the drier side) than the objective impedance value Oi1 used in the power generation during operation. Accordingly, the ECU 96 tends to judge that the inside of the fuel cell stack 12 contains water in the power generation during operation. The impedance value in the fuel cell stack 12 depends also on the temperature. Therefore, the ECU 96 has shutdown impedance thresholds Ti of multiple kinds as map information corresponding to temperature variation, and sets an appropriate shutdown impedance threshold Ti based on the coolant outlet temperature detected by the coolant outlet temperature sensor 92a. If the coolant outlet temperature sensor 92a has some trouble, the temperature of the cathode off-gas that is detected by the cathode outlet temperature sensor 92b may be used instead.

The water content in the fuel cell stack 12 is linked also to the amount of circulation of the coolant by the cooling devices 18. Accordingly, the ECU 96 may be configured to estimate the state of dryness in the fuel cell stack 12 based on the rotational speed (rpm) of the coolant pump 90 among the cooling devices 18. For example, the ECU 96 estimates that the fuel cell stack 12 is dry if the rotational speed of the coolant pump 90 is equal to or greater than a given shutdown rotational speed threshold Tr and the period for which it is above the shutdown rotational speed threshold Tr is equal to or longer than a given period of time.

Further, the condition (d) is used as a condition for the execution of the power generation at shutdown because, in the first place, the water content in the fuel cell stack 12 cannot be monitored if the impedance measuring device 94 is malfunctioning. If the impedance measuring device 94 is malfunctioning, the fuel cell system 10 does not perform the power generation at shutdown and instead, when the vehicle 11 is started next time (at low-temperature starting), it performs a process in which the vehicle 11 is placed in a standby state and power generation operation is performed for an extended period of time.

The conditions (c) and (d) above can be judged by monitoring the state of dryness and the state of fault using a status register or the like (not shown) in the power generation during operation of the fuel cell system 10 (by changing status flags) and checking the flags in the execution condition judging step. On the other hand, the conditions (a) and (b) are judged in the execution condition judging step.

Returning to FIG. 3, the ECU 96 judges that the conditions for the execution of power generation at shutdown are met if the conditions (a) to (d) above are all met (step S3: YES) and moves to step S4. On the other hand, if even one of the conditions (a) to (d) above is not met, the ECU 96 judges that the conditions for executing the power generation at shutdown are not met (step S3: NO) and skips the following steps S4 and S5.

In step S4, the ECU 96 performs the power generation at shutdown in order to dry the inside of the fuel cell stack 12 (power generation at shutdown step). In this power generation at shutdown, the fuel cell stack 12 generates electric power through similar operation to that in the power generation during operation. However, high-current power generation is not performed because it increases the water content in the fuel cell stack 12, and the power generation is performed at lower current than in normal power generation. The execution of the power generation at shutdown promotes the drying of the power generation cells 20 in the fuel cell stack 12. The electric power generated during the power generation at shutdown is supplied to the auxiliary machinery, and surplus power is charged into the battery Bt. It is preferred that the power generation at shutdown is performed at such low current that the auxiliary machinery requires to continue the power generation.

Further, as shown in FIG. 4, during the power generation at shutdown, the ECU 96 acquires the impedance value of the entirety of the power generation cells 20 measured by the impedance measuring device 94, and compares the impedance value with an objective impedance value Oi2 that is set for the power generation at shutdown. Then, the ECU 96 continues the power generation at shutdown if the impedance value is lower than the objective impedance value Oi2. On the other hand, if the impedance value becomes equal to or higher than the objective impedance value Oi2, then it ends the power generation at shutdown.

The ECU 96 sets the objective impedance value Oi2 for the power generation at shutdown to be higher than the objective impedance value Oi1 during operation and the shutdown impedance threshold Ti. In other words, the objective impedance value Oi1 in power generation during operation is set to a value corresponding to a higher water content in order to reduce deterioration of the fuel cell stack 12, and the objective impedance value Oi2 in power generation at shutdown is set to a value corresponding to a lower water content.

When the inside of the fuel cell stack 12 is dried and the water content becomes low, a state is established in which the conduction through the water in the plurality of power generation cells 20 is reduced. The impedance value measured by the impedance measuring device 94 becomes stable (repeats small amplitudes) slightly above the objective impedance value Oi2 in the power generation at shutdown.

During the execution of the power generation at shutdown, the ECU 96 performs low-load power generation (idle power generation) when the state of charge (SOC) of the battery Bt is equal to or above a given ratio. During the idle power generation, the amounts of the anode gas and cathode gas supplied into the fuel cell stack 12 are minimized to considerably lower the power generation current of the fuel cell stack 12.

Now, as the power generation current lowers in the idle power generation, the impedance measuring device 94 may become unable to measure the impedance value. Accordingly, when performing the idle power generation during power generation at shutdown, the ECU 96 estimates variation of the impedance value so that the power generation at shutdown can be continued without interruption.

More specifically, when moving to idle power generation, the ECU 96 stops comparing the measured impedance value with the objective impedance value Oi2, and starts counting time to terminate the power generation at shutdown when the counted time has exceeded an idle power generation execution time. The idle power generation execution time can be calculated based on the temperature at the coolant outlet, the temperature of auxiliary machinery included in the cathode-related devices 16 (the compressor 70, the intercooler for cooling the air discharged from the compressor 70, etc.), and the cathode off-gas temperature that are related to impedance variation. It is then possible to promote uniform drying in the fuel cell stack 12 even when the temperature of the fuel cell stack 12 gradually decreases as the idle power generation is being performed.

If the ECU 96 has stopped the power generation at shutdown during the execution of idle power generation because, for example, the coolant outlet temperature, the temperature of the auxiliary machinery included in the cathode-related devices 16, or the cathode off-gas temperature has decreased below given value, then the ECU 96 performs control so as to, at the next starting (low-temperature starting), place the vehicle 11 in a standby state and perform power generation for an extended period of time. This prevents the voltage of the power generation cells 20 from becoming unstable at the low-temperature starting.

Further, in step S5, the ECU 96 performs a continuous power generation process, where the power generation of the fuel cell stack 12 is continued even after the impedance value has exceeded the objective impedance value Oi2 in the power generation at shutdown after the execution of the power generation at shutdown (continuous power generation step). That is, in the stack 21 of the plurality of power generation cells 20, power generation cells 20 located in a central area in the stacking direction (central cells) are dried earlier in the power generation at shutdown, but the drying of power generation cells 20 located in areas at both ends of the stacking direction (marginal cells) tends to be delayed. Accordingly, in the fuel cell system 10 of the embodiment, the power generation operation is continued for a given period of time after the execution of the power generation at shutdown, in order to further dry the marginal cells to achieve a uniform water content in the power generation cells 20 throughout the central and marginal areas in the stack 21.

Figure 5:
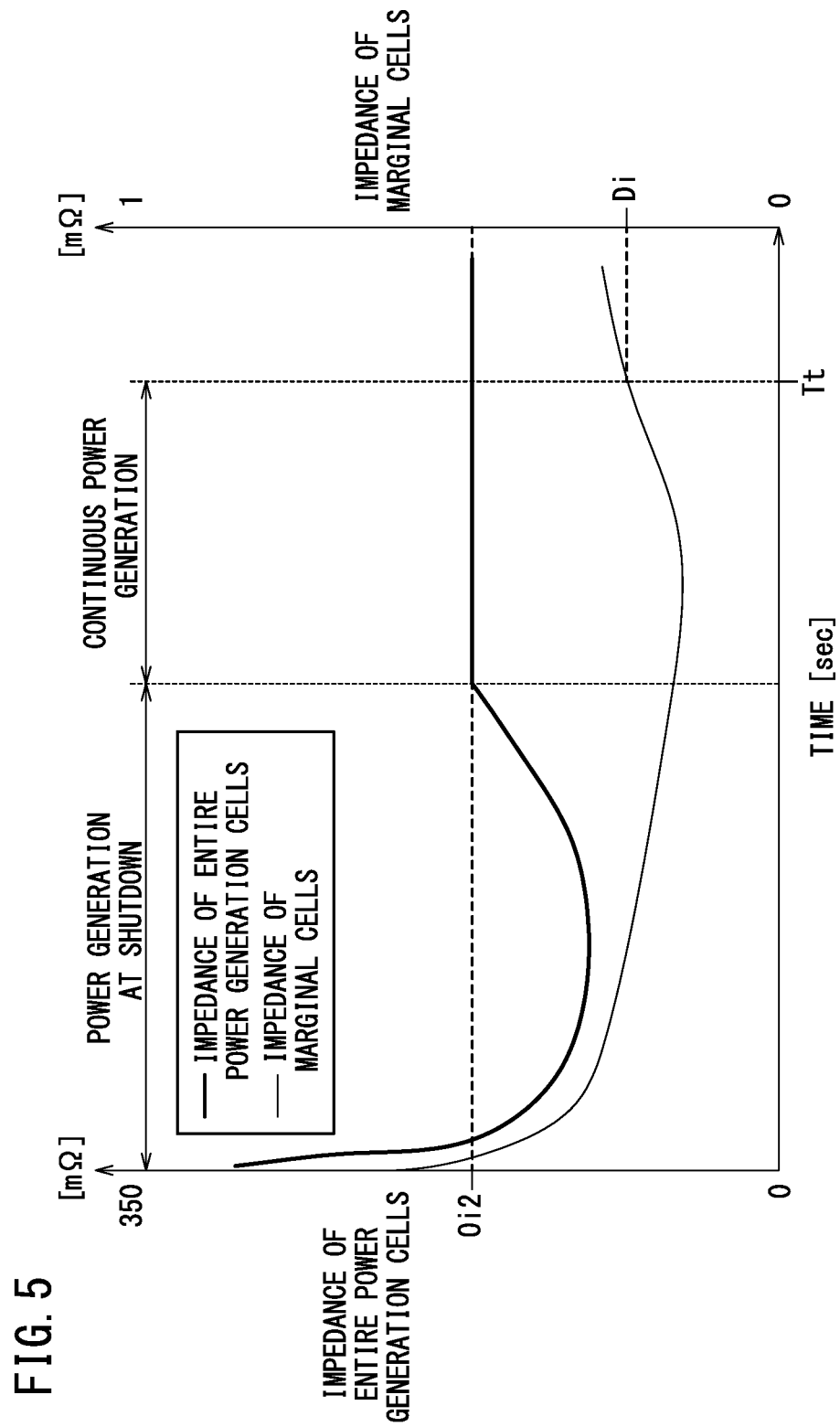
FIG. 5 is a graph showing time variations in the impedance value of the entirety of the multiple power generation cells and the impedance value of cells located at the ends, during the power generation at shutdown and the continuous power generation.

Specifically, as shown in FIG. 5, in the continuous power generation step, the ECU 96 sets a time threshold Tt as to the period for which the continuous power generation is to be performed, and starts counting time. Then, the ECU 96 monitors whether the counted time becomes equal to or greater than the time threshold Tt. The ECU 96 carries on the continuous power generation while the counted time is below the time threshold Tt, and terminates the continuous power generation when the counted time becomes equal to or greater than the time threshold Tt. Preferably, the time threshold Tt is set within a range of about 200 to 500 seconds, for example.

In the continuous power generation, as in the power generation at shutdown, the anode gas and cathode gas are supplied into the fuel cell stack 12 to cause power generation in the power generation cells 20 including marginal cells. The amount of power generation of the fuel cell stack 12 in the continuous power generation can be set to about the same level (an identical or somewhat varied level) as the amount of power generation in the power generation at shutdown, and so the ECU 96 controls the amounts of supply of the anode gas and cathode gas to about the same amounts as in the power generation at shutdown.

Further, as shown in FIG. 4, it is preferred that, in the continuous power generation, the ECU 96 sets the rotational speed of the coolant pump 90 at or above a given objective rotational speed Or, so as to increase the amount of circulation of the coolant higher than in normal power generation. For example, the objective rotational speed Or is set to a rotational speed that is equal to or higher than the shutdown rotational speed threshold Tr. Thus, the execution of the continuous power generation reduces unevenness in temperature in the stack 21 of the multiple power generation cells 20 and promotes the drying of the marginal cells. The control to set the rotational speed of the coolant pump 90 at or above the objective rotational speed Or may be performed during the execution of the power generation at shutdown (step S4).

In this way, through the execution of the continuous power generation step, as shown in FIG. 5, the impedance of the marginal cells gradually rises, while the impedance value of the entirety of the multiple power generation cells 20 does not vary considerably from the objective impedance value Oi2. After the execution of the continuous power generation (after the time threshold Tt has been passed), the impedance of the marginal cells becomes equal to or above a dry end impedance value Di at which the marginal cells are considered to have been dried. Thus, the execution of the continuous power generation further promotes the drying of the marginal cells in the fuel cell stack 12 and achieves uniform dryness in the stacking direction.

After the execution of the continuous power generation (step S5), or if the conditions for the power generation at shutdown are not met in step S3, the ECU 96 performs terminating processing in step S6. In the terminating processing, the operations of the fuel cell system 10 (coolant pump 90 etc.) are stopped in an appropriate manner together with the stopping of operation of the vehicle 11.

The present invention is not limited to the embodiments described above, and various modifications are possible based on the essence and gist of the invention. For example, the impedance measuring device 94 is not limited to the configuration that measures the impedance value of the entire stack 21 (multiple power generation cells 20), but it may be configured to measure the impedance value of some of the power generation cells 20 (e.g. central cell(s)). The shutdown impedance threshold Ti, objective impedance value Oi1, and objective impedance value Oi2 can be set to appropriate values according to the impedance value measured by the impedance measuring device 94. The relationship between the shutdown impedance threshold Ti and the objective impedance value Oi2 may be set so that Ti=Oi2, Ti>Oi2, for example.

Technical ideas and effects that can be grasped from the embodiments described above will be recited below.

An aspect of the present invention provides a method of stopping the operation of a fuel cell system 10 including a fuel cell stack 12 having a stack 21 of a plurality of power generation cells 20 that generate electric power through a reaction between an anode gas and a cathode gas, and an impedance measuring unit (impedance measuring device 94) for measuring an impedance of the fuel cell stack 12. The method includes a power generation at shutdown step of, when stopping the operation, operating the plurality of power generation cells 20 to generate electric power, until the impedance value measured by the impedance measuring unit becomes equal to or greater than an objective impedance value; and a continuous power generation step of, after the impedance value has become equal to or greater than the objective impedance value, further continuing the power generation of the plurality of power generation cells 20 for a given period of time.

According to the method of stopping the operation of the fuel cell system 10, the stacked, multiple power generation cells 20 can be dried more uniformly by performing the continuous power generation step after the execution of the power generation at shutdown step. This enables the fuel cell system 10 to more reliably avoid the freezing of the multiple power generation cells 20. This in turn prevents stoppage of power generation at the next low-temperature starting and shortens the starting time, which improves the marketability.

The fuel cell system 10 further includes a coolant pump 90 for circulating coolant between the fuel cell stack 12 and a radiator 88, and, in the continuous power generation step, the method sets the rotational speed of the coolant pump 90 to be equal to or greater than a given objective rotational speed Or. Then, in the continuous power generation step, the rate of circulation of the coolant to the fuel cell stack 12 is increased, whereby a uniform temperature distribution is achieved throughout the multiple power generation cells 20, which further promotes the drying of the marginal cells.

Further, in the power generation at shutdown step, the objective impedance value Oi2 is set to be higher than an objective impedance value Oi1 that is used during the operation of the fuel cell system 10. Thus, in the fuel cell system 10, the multiple power generation cells 20 can be dried more reliably in the power generation at shutdown step.

Further, in the power generation at shutdown step, the method performs a low-load power generation in which the amount of power generation current of the fuel cell stack 12 is lowered based on the SOC of the battery Bt, and continues the power generation at shutdown step even if the impedance measuring unit (impedance measuring device 94) becomes unable to measure the impedance as the low-load power generation is performed. Thus, the fuel cell system 10 does not stop the power generation at shutdown even if the impedance measuring unit is unable to measure the impedance, so that the inside of the fuel cell stack 12 can be dried without fail.

Further, in the execution of the low-load power generation, the method estimates the impedance of the fuel cell stack 12 based on a temperature of the coolant flowing out from the fuel cell stack 12 or a temperature of auxiliary machinery of the fuel cell system 10. Thus, even when the low-load power generation is executed in the power generation at shutdown step, it is possible to complete the power generation at shutdown step based on the estimated impedance.

Further, before the execution of the power generation at shutdown step, the method performs a condition judging step of determining whether it is winter or not, and performs the power generation at shutdown step if the determination indicates that it is winter, and does not perform the power generation at shutdown step if the determination indicates that it is not winter. Thus, the fuel cell system 10 performs the power generation at shutdown and continuous power generation in winter, while preventing lowering of fuel efficiency by not performing the power generation at shutdown and continuous power generation in seasons other than winter.

What is claimed is:

1. A method of stopping operation of a fuel cell system including a fuel cell stack having a stack of a plurality of power generation cells that generate electric power through a reaction between an anode gas and a cathode gas, and an impedance measuring unit for measuring an impedance of the fuel cell stack, the method comprising:
   when stopping the operation, performing power generation at shutdown to cause the plurality of power generation cells to generate electric power, until an impedance value measured by the impedance measuring unit becomes equal to or greater than an objective impedance value; and
   after the impedance value has become equal to or greater than the objective impedance value, performing continuous power generation in which the power generation of the plurality of power generation cells is further continued for a given period of time.

2. The fuel cell system operation stopping method according to claim 1, wherein
   the fuel cell system further includes a coolant pump for circulating a coolant between the fuel cell stack and a radiator, and
   in the continuous power generation, the method sets a rotational speed of the coolant pump to be equal to or greater than a given objective rotational speed.

3. The fuel cell system operation stopping method according to claim 1, wherein, in the power generation at shutdown, the objective impedance value is set to be higher than an objective impedance value used during operation of the fuel cell system.

4. The fuel cell system operation stopping method according claim 1, wherein
   in the power generation at shutdown, the method performs a low-load power generation in which an amount of power generation current of the fuel cell stack is lowered based on a state of charge of a battery, and continues the power generation at shutdown even if the impedance measuring unit becomes unable to measure the impedance as the low-load power generation is performed.

5. The fuel cell system operation stopping method according claim 4, wherein, in the execution of the low-load power generation, the method estimates the impedance of the fuel cell stack based on a temperature of a coolant flowing out from the fuel cell stack or a temperature of auxiliary machinery of the fuel cell system.

6. The fuel cell system operation stopping method according claim 1, wherein, before the execution of the power generation at shutdown, the method makes a determination about a condition as to whether it is winter or not, and performs the power generation at shutdown if the determination indicates that it is winter, and does not perform the power generation at shutdown if the determination indicates that it is not winter.

* * * * *